United States Patent [19]

McIver

[11] Patent Number: 5,136,352
[45] Date of Patent: Aug. 4, 1992

[54] GAMMA REJECTING INFRARED DETECTOR

[75] Inventor: George W. McIver, Redondo Beach, Calif.

[73] Assignee: TRW Inc., Redondo Beach, Calif.

[21] Appl. No.: 730,153

[22] Filed: Jul. 15, 1991

[51] Int. Cl.$^5$ .................. H01L 27/14; H01L 29/12; H01L 27/12
[52] U.S. Cl. .................................. 357/30; 357/58; 357/4
[58] Field of Search ...................... 357/30, 58, 4

Primary Examiner—Mark V. Prenty
Attorney, Agent, or Firm—G. Gregory Schivley; Ronald L. Taylor

[57] ABSTRACT

This invention discloses an infrared detector which separates current induced by incident gamma ray radiation for use in a radiation environment. The infrared detector includes a semiconductor which includes a first layer heavily doped with n-type atoms, a second undoped layer and a third layer lightly doped with n-type atoms. At least one heavily doped n-type contact region and one heavily doped p-type contact region are embedded in the third layer. Both incident gamma ray photons and infrared photons release charge carriers in the second layer which travel as conduction current through the semiconductor. Since gamma rays are of high energy, they can release electrons from the valence band into the conduction band. When an electron is released from the valence band a hole is generated in its place which acts as current charge carrier. The electron released into the conduction band travels to the first layer and the hole travels to the p-type contact region under the influence of an electric field. An infrared photon, however, will only have enough energy to release an electron in the impurity band of the second layer to the conduction band. Therefore, there is no hole current collected at the p-type contact regions. When an electron is released from the impurity band, an electron from the n-type contact region replaces this electron. Consequently, current induced by gamma and infrared radiation can be separated.

15 Claims, 1 Drawing Sheet

GAMMA REJECTING INFRARED DETECTOR

BACKGROUND OF THE INVENTION

1. Field of the Invention

This invention relates generally to an infrared detector, and more particularly, to an infrared detector which separates current induced by gamma ray radiation from current induced by infrared radiation.

2. Discussion of the Related Art

Infrared detectors for detecting infrared radiation typically to monitor temperature or temperature gradients are known in the art. There exists a wide range of different applications, however, in which one would want to utilize an infrared detector. These applications range from generating a night time image to infrared spectroscopy. Some of these applications require infrared detection from a remote location in a radiation environment such as may be encountered in space and performed upon certain satellites. Other infrared detection application in radiation environments are also known.

Typically an infrared detector will be an electrical device which will respond to incident infrared radiation. One problem in any type of electrical detector is the minimum threshold of observable incident energy ascertainable because of the existence of electrical noise. For an infrared detector, the incident infrared radiation must generate enough energy within the detecting material to raise the detectable energy level above the system noise level. In most designs, the infrared detector will be cooled to a very low temperature to reduce the interference caused by electrical noise.

Other factors may add to the degradation of the minimum threshold of observable energy. In a radiation environment, the amount of interfering radiation as a result of gamma rays presents a significant problem in infrared detectors since the gamma rays are at a high energy level, and thus, the gamma rays add significantly to the noise of the infrared detecting device. It is therefore necessary that the gamma ray interference be kept below the system noise level.

The most popular infrared detectors include a semiconductor semiconductor appropriately configured such that an interacting infrared photon will create charge carriers by giving up energy to bound electrons within the semiconductor material. If a bias voltage is applied to the semiconductor material the charge carriers will add to the current which can then be measured to observe increases in current indicating photon interaction. Since a gamma photon will have more energy than an infrared photon, it is more apt to generate more and higher energy charge carriers creating greater current in the semiconductor material. Consequently, the amount of current within the semiconductor device caused by the gamma radiation raises the current above the system noise level of the device such that the current caused by the infrared radiation is obscured. Different methods are known in the art for reducing the current in an infrared semiconductor detector caused by incident gamma radiation, such as providing undoped blocking layers, but these types of detectors have met with limited success.

What is needed then is an infrared detector which includes a method of separating the current caused by incident gamma radiation for use in a high radiation environment. It is therefore an object of the present invention to provide such an infrared detector.

SUMMARY OF THE INVENTION

Disclosed is an infrared detector comprised of a semiconductor device which separates the current generated by incident infrared radiation from the current generated by incident gamma radiation. More particularly, the semiconductor device includes a heavily doped n-type bottom layer, an undoped middle layer and a lightly doped n-type top layer. The top layer includes at least one heavily doped n-type and one heavily doped p-type terminal contact region, and will generally include a plurality of these terminals. A positive bias voltage is applied to the bottom layer and the terminal contact regions are grounded.

If the semiconductor infrared detector is in a radiation environment having both infrared and gamma radiation, the gamma radiation photons will possess enough energy to release an electron from the valence band of the lightly doped region into the conduction band, whereas, the infrared radiation photons will not. The infrared photons will, however, possess enough energy to release dopant electrons bound in the impurity bands to the conduction band. Consequently, the radiation from the gamma photons will create electron and hole charge pair carriers, but the infrared photons will only create an electron charge carrier since charge carrying holes do not exist in the impurity band. The holes will be driven by the electric field created by the voltage bias towards the positively doped terminal contact regions and the electrons will be driven by the electric field towards the negatively doped bottom layer. Each electron released from the impurity bands will be replaced by an electron from the negatively doped terminal contact region. Accordingly, the current measured at the positively doped terminal contact region will only include current generated by gamma radiation and the current measured at the negatively doped terminal contact region will include current generated by the infrared photons and the gamma photons. Since gamma rays are relatively short lived compared to infrared photons in a radiation event, it is possible to measure the current at the positively doped terminal to determine when the gamma ray induced current is below a certain threshold level, thus enabling the current to be measured at the negatively doped terminals as indicative of mainly infrared generated current.

Additional objects, advantages, and features of the present invention will become apparent from the following description and appended claims, taken in conjunction with the accompanying drawings.

DETAILED DESCRIPTION OF THE PREFERRED EMBODIMENTS

The following description of the preferred embodiment is merely exemplary in nature and is in no way intended to limit the invention or its application or uses.

In a radiation environment, high energy gamma rays are emitted from the nuclei of certain atoms. When the gamma rays impinge an infrared semiconductor detector, individual gamma ray photons are absorbed by electrons in the valence level band of the semiconductor material. The added energy to the electrons releases them into the conduction band where they are added to the measurable current of the device. Since this current addition adds a significant amount of current above the normal noise level of the device, it reduces system effectiveness to detect low energy infrared photons. It is therefore necessary to remove or separate the current caused by gamma ray photons in order to effectively detect the current caused by infrared photons in a semiconductor infrared detector.

Figure 1:
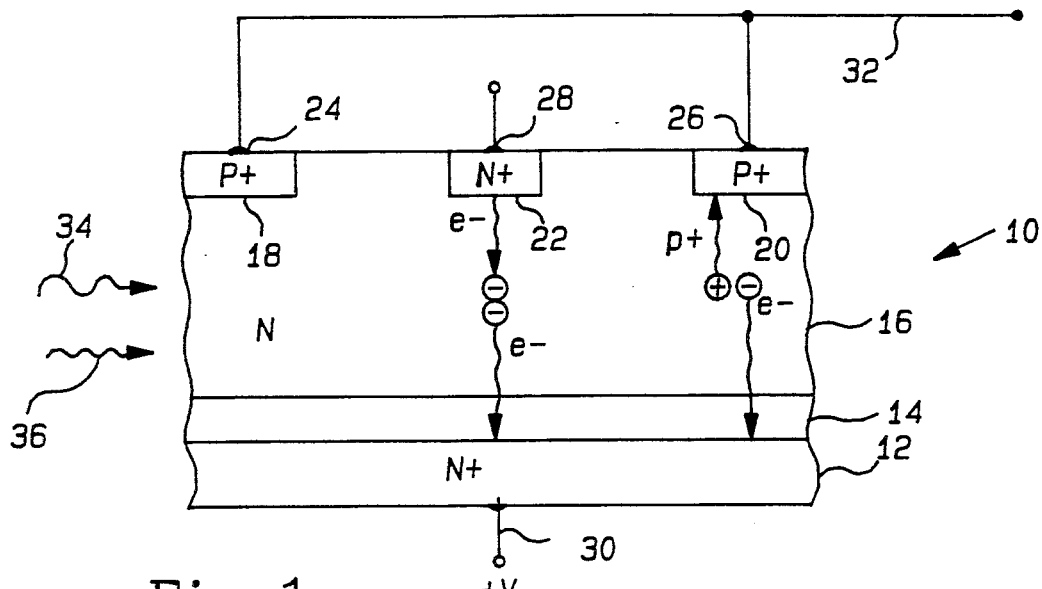
FIG. 1 is a cross section type diagram of an infrared semiconductor detector according to a preferred embodiment of the present invention.

Turning to FIG. 1, a basic understanding of a semiconductor-type infrared detector, according to a preferred embodiment of ;the present invention, can be attained. A semiconductor device 10, generally silicon, is shown having appropriately doped regions to control charge mobility as is well understood to those skilled in the art. More particularly, semiconductor device 10 includes a heavily doped n-type bottom layer 12 of about $2 \times 10^{19}$ dopant atoms/cm$^3$. A subsequent intrinsic undoped layer 14 is formed on top of the doped layer 12, i.e., it is substantially pure silicon. The bulk of semiconductor device 10 is a lightly doped n-type region 16 of about $2 \times 10^{18}$ dopant atoms formed on top of undoped layer 14. Within region 16, and opposite to undoped layer 14, are three terminal contact regions 18, 20, and 22, as shown. Terminal contact regions 18 and 20 are of a heavily doped p-type region, whereas, terminal contact region 22 is a heavily doped n-type region. Contact regions 18, 20 and 22 typically have nearly the same impurity density as layer 12. All of the doped and undoped regions are formed by well known methods to those skilled in the art including, but not limited to ion implantation, epitaxial growth, diffusion techniques, etc. A contact 30 is electrically connected to heavily doped n-type region 12. Further, contacts 24 and 26 are electrically connected to heavily doped p-type regions 18 and 20, and contact 28 is electrically connected to n-type doped region 22. Contacts 24 and 26 are connected to a single line 32. As discussed above, semiconductor device 10 is preferably silicon. The p-type dopants can be any appropriate acceptor atom such as indium and the n-type dopant can be any appropriate donor atom such as arsenic. As is well understood other semiconductor material and dopants can be used without departing from the spirit and scope of the invention.

In a radiation environment, incident electromagnetic energy, shown in FIG. 1 as an infrared photon 34 and a gamma ray photon 36 each having energy hv, where h is Planck's constant and $v$ is frequency, is incident upon semiconductor device 10. Semiconductor device 10 will be part of an infrared detector housed in any appropriate arrangement well known in the art. Photons 34 and 36 will impinge semiconductor device 10 whether it be through the housing walls or through an appropriately configured window (not shown).

In operation of the detector, a bias voltage, typically about 3 volts, is placed across contact 30 and line 32, and contacts 30 and 28. It is qualitative to view contacts 24, 26 and 28 as being at ground and contact 30 as being applied with the 3 volts. Without any incident radiation, negligble current travels through semiconductor device 10 because minimal charge carriers exist in the conduction band of region 16 at normal temperatures, and further, undoped layer 14 acts as a virtual insulator. The conduction band represents the energy level where electrons are free to travel throughout the semiconductor device 10. In region 16, most of the electrons will exist in an energy level defined by the valence band of the particular silicon atoms. In the valence band, the electrons are bound to the atoms, and thus do not add to any current travel within the semiconductor device 10. The electric field created by the bias voltage is not strong enough to establish enough energy to enable very many of the bound electrons in regions 16, 18, 20 or 22 to be released into the conduction band and travel across undoped layer 14. These electrons require an additional amount of energy to be released from the valence band of the atoms into the conduction band.

When a gamma photon 36 impinges semiconductor device 10, it will typically have enough energy, as represented by its frequency, such that an electron in the valence band which absorbs the gamma photon 36 will be released into the conduction band. In the presence of the electric field applied to the contacts as described above, the released electron will travel toward the positive contact connected to the heavily doped n-type region of layer 12. The released electron leaves a hole in the place where it was bound in the valence band. As is well known in the art, holes also represent charge carrying particles. Under the influence of the electric field, holes will travel toward the ground terminals connected to regions 18 and 20. This can be shown in FIG. 1 as the event depicted below p-type region 20. As is apparent, the plus charged hole travels toward the p-doped region 20 and the electron travels toward the n-doped layer 12.

Typically, an infrared photon will not possess enough energy (about 0.1 ev) to enable the bound electrons in the valence band to be released into the conduction band. In region 16, the silicon will contain a certain density of impurity atoms. Since this region is lightly doped with an n-type material, there exists a free electron for every dopant atom which is not bound by the covalent bonds of the lattice structure. These electrons generally exist at an impurity level having an energy slightly less than the energy of the conduction band. Electrons in this energy level are loosely bound to their atoms, and thus do not require very much additional energy to be released into the conduction band. An infrared photon 34 will have enough energy to release an electron from an impurity band to the conduction band. Since the electron is not in the valence band, it does not represent a valence hole location. In other words, when the electron is lifted from the impurity band to the conduction band a charge carrying hole is not left behind. When the electron is lifted into the conduction band it is free to travel through the semiconductor, and thus, is diffused under the influence of the electric field. In addition, since the heavily doped n-type region 22 contains many more electrons in the impurity band than in the impurity band of the lightly doped n-region 16, an electron from region 22 readily takes the position of the electron which was just released into the conduction band. This process can be depicted by the event below n-type region 22. As is apparent, the electron which travels to layer 12 is replaced by an electron from n-type region 22.

Therefore, by measuring the current at the heavily doped positive regions 18 and 20 on line 32 and measuring the current at the heavily doped negative region 22, the current from gamma events and infrared events can be separated. Gamma ray photons will also free electrons in the impurity bands. However, since the gamma radiation from a radiation event is short lived, an appreciable amount of current at the positive terminals will typically only occur at the beginning of the radiation event, and thus, the current measured at the negative terminals will be indicative of only infrared radiation shortly after the beginning of the radiation event.

Figure 2:
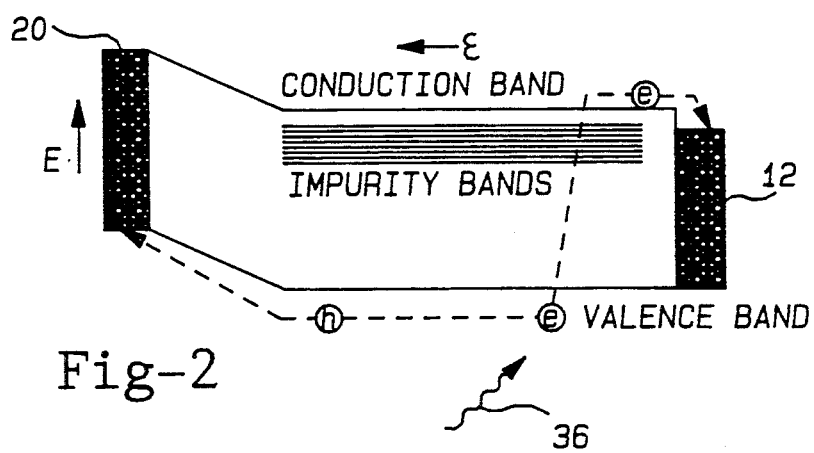
FIG. 2 is an energy band diagram depicting the energy transitions of a gamma ray event.
Figure 3:
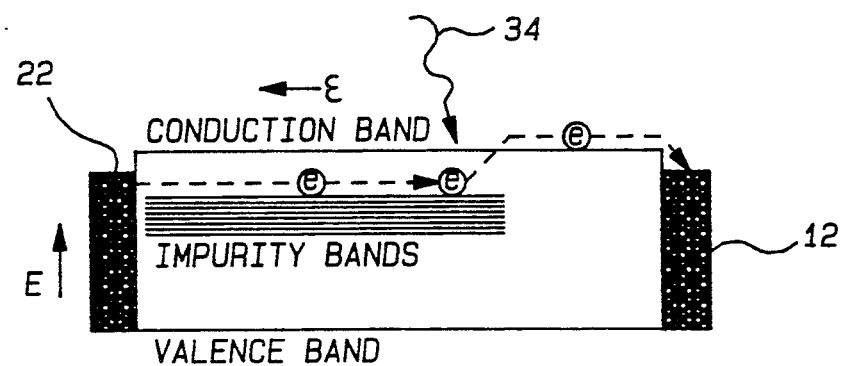
FIG. 3 is an energy band diagram depicting the energy transitions of an infrared event.

FIGS. 2 and 3 give a better understanding of what happens when an electron absorbs an infrared or gamma ray photon. In FIG. 2, an energy band diagram for a gamma ray photon event is depicted. The left shaded region represents the heavily doped p-type region 20. It can also represent region 18. The shaded region on the right is the heavily doped n-type region 12. The top line connecting these two regions is the lowest energy level of the conduction band, and the bottom line connecting these two regions is the highest energy level of the valence band, as is well known in the art. Most of the energy bands between the conduction band and the valence band are forbidden energy levels, however, a range of bands proximate the conduction band exist as impurity bands. For a silicon semiconductor, the energy difference between the valence and conduction bands would be 1.1 electron volts.

Returning to FIG. 2, an electron in the valence band may absorb a gamma ray photon 36. This absorbed energy gives the electron enough energy to release it from the valence band into the conduction band. This is shown by the dotted line from the valence band to the conduction band. Once the electron reaches the conduction band, it is free from the atom to which it was bound in the valence band and thus adds to the current which is collected by the heavily doped n-type region 12, as shown. In the same event, the opening left by the electron in the valence band is a charge carrying hole. Holes also add to the current flow in the semiconductor material since adjacent electrons to the hole in the valence band do not need to gain energy in order to move from one atom to an adjacent atom. Consequently, the electrons move towards n-type region 12 under the influence of the electric field and the holes move toward the heavily doped p-type region 20. Therefore, only hole induced current is collected at p-type region 20. If an electron in the valence band absorbs an infrared photon, it does not acquire enough energy to jump from the valence band to the conduction band. Since there are virtually no energy levels between the valence band and the impurity bands which the electrons could occupy, the electron cannot be released from its atom. Generally, the electron will give up this acquired energy from the infrared photon in the form of lattice vibrations.

Now turning to FIG. 3, a band diagram for an infrared event is depicted In FIG. 3, the left contact region is replaced by the heavily doped n-type region 22. It is apparent now that regions 22 and 12, both being heavily doped with n atoms are on the same energy levels. The same potentials are applied across these two regions as was with layers 12 and 20 discussed above. This is represented by the direction of the electric field as shown. In an n-type doped impurity semiconductor region, as is region 16, each of the outer electrons of the impurity atoms will be included in a covalent bond with the silicon atoms except for one electron per atom. For certain desirable impurities, the energies of these electrons are in an energy level in the impurity bands between the valence band and the conductor band just below the conduction band. Consequently, an electron in these bands requires less energy to be lifted into the conduction band to add to the current in the semiconductor. Specifically, an electron in an impurity band as shown, absorbs an infrared photon 34 and is lifted by this added energy to the energy level of the conduction band. Once the electron is lifted to the conduction band it travels under the influence of the electric field towards the heavily doped n-type region 12, as shown. Once this happens, an electron in the heavily doped n-type region 22 is free to travel along the impurity band as shown to the location which the original electron was in without acquiring any additional energy. Therefore, there is no hole current which will be collected by the heavily doped p-type regions 18 and 20 since the original electron did not originate in the valence band, the only place charge carrying holes can exist.

It is thus apparent that by measuring the current traveling through contact 28 a representation of the intensity of incident infrared radiation can be measured without the interference of current generated by incident gamma ray radiation.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. An infrared detector including a semiconductor device, said semiconductor device comprising:
   a first layer being heavily doped with n-type impurity atoms;
   a second layer adjacent to the first layer, said second layer being a substantially undoped layer;
   a third layer adjacent the second layer and opposite the first layer, said third layer being lightly doped with n-type impurity atoms;
   a first contact region being heavily doped with n-type impurity atoms;
   a second contact region being heavily doped with p-type impurity atoms, said first and second contact regions being in contact with the third layer;
   bias means for applying a potential across both the first layer and the first contact region and across the first layer and the second contact region; and
   current measuring means for collecting charge current at the first contact region and current measuring means for collecting charge current at the second contact region, wherein current collected from the first contact region is substantially current generated by incident infrared radiation and current collected by the second contact region is substantially current generated by incident gamma ray radiation.

2. The infrared detector according to claim 1 wherein the semiconductor is silicon.

3. The infrared detector according to claim 1 wherein the third layer comprises substantially the entire mass of an epitaxial layer grown on a substrate.

4. The infrared detector according to claim 1 wherein the first and second contact regions are embedded in the third layer.

5. The infrared detector according to claim 1 wherein the first and second contact regions are a plurality of contact regions wherein each of the first contact regions are interconnected and each of the second contact regions are interconnected.

6. The infrared detector according to claim 1 wherein the bias means applies a positive potential to the first layer.

7. The infrared detector according to claim 6 wherein the bias means applies approximately a 3 volt potential.

8. An infrared detector including a semiconductor device, said semiconductor device comprising:
   a first layer being heavily doped with n-type impurity atoms.
   a second layer being lightly doped with n-type impurity atoms;
   a first contact region being heavily doped with n-type impurity atoms;
   a second contact region being heavily doped with p-type impurity atoms, said first and second contact regions being in contact with the second lightly doped layer; and
   bias means for applying a potential across both the heavily doped first layer and the first contact region and the heavily doped first layer and the second contact region, wherein current collected from the first contact region is substantially current generated by incident infrared radiation and current collected by the second contact region is substantially current generated by incident gamma ray radiation.

9. The infrared detector according to claim 8 further comprising a third layer formed between the lightly doped second layer and the heavily doped first layer, said third layer being an undoped layer.

10. The infrared detector according to claim 8 wherein the first and second contact regions are a plurality of contact regions wherein each of the first contact regions are interconnected and each of the second contact regions are interconnected.

11. The infrared detector according to claim 8 wherein the bias means applies a positive potential to the heavily doped first layer.

12. The infrared detector according to claim 8 wherein the semiconductor is silicon.

13. A method of detecting infrared radiation comprising the steps of:
   forming a semiconductor device having a first layer of a heavily doped n-type material, a second layer of a substantially undoped material on top of said first layer, a third layer of a lightly doped n-type material on top of said second layer, a first contact region of a heavily doped n-type material within said third layer and a second contact region of a heavily doped p-type material within said third layer;
   applying a bias potential across the first layer and the first contact region and across the first layer and the second contact region; and
   measuring the current at the first contact region and the current at the second contact region, wherein the measure current at the first contact region is substantially current induced by incident infrared radiation and the measured current at the second contact region is substantially current induced by incident gamma ray radiation.

14. The method according to claim 13 wherein the step of forming said first and second contact regions includes the step of forming a plurality of first and second contact regions wherein each of the first contact regions are interconnected and each of the second contact regions are interconnected.

15. The method according to claim 13 wherein the step of applying a bias potential includes applying a positive bias potential to the first layer.

* * * * *